US012787717B2

(12) United States Patent
Lee et al.

(10) Patent No.: US 12,787,717 B2

(45) Date of Patent: Nov. 3, 2026

(54) INFLUENCE FUNCTION-BASED MITIGATION OF SUBSTRATE DEFORMATION WITH FILM DEPOSITION AND ION IMPLANTATION

(71) Applicant: Applied Materials, Inc., Santa Clara, CA (US)

(72) Inventors: Wonjae Lee, Fremont, CA (US); Pradeep Kumar Subrahmanyan, San Jose, CA (US); D. Jeffrey Lischer, Acton, MA (US); Frank Sinclair, Hartland, ME (US)

(73) Assignee: Applied Materials, Inc., Santa Clara, CA (US)

(*) Notice: Subject to any disclaimer, the term of this patent is extended or adjusted under 35 U.S.C. 154(b) by 346 days.

(21) Appl. No.: 18/431,884

(22) Filed: Feb. 2, 2024

(65) Prior Publication Data

US 2024/0266233 A1 Aug. 8, 2024

Related U.S. Application Data

(60) Provisional application No. 63/511,414, filed on Jun. 30, 2023, provisional application No. 63/502,452, (Continued)

(51) Int. Cl.

| | |
|---|---|
| ***H10P 74/20*** | (2026.01) |
| ***C23C 14/48*** | (2006.01) |

(Continued)

(52) U.S. Cl.

CPC ............ *H10P 74/203* (2026.01); *C23C 14/48* (2013.01); *C23C 14/54* (2013.01); *C23C 14/547* (2013.01); (Continued)

(58) Field of Classification Search

CPC ............... H10P 74/203; H10P 14/6518; H10P 14/6539; H10P 30/20; H10P 30/40; (Continued)

(56) References Cited

U.S. PATENT DOCUMENTS 10,754,319 B1 8/2020 Good et al.
10,818,611 B2 * 10/2020 Chang ................ H10W 42/121
(Continued)

FOREIGN PATENT DOCUMENTS

CN 111725051 A 9/2020
CN 113594309 A 11/2021
(Continued)

OTHER PUBLICATIONS

International Search Report and Written Opinion for International Application No. PCT/US2024/014670, mailed Jun. 10, 2024, 8 Pages.
(Continued)

*Primary Examiner* — Seung C Sohn

(74) *Attorney, Agent, or Firm* — Lowenstein Sandler LLP

(57) ABSTRACT

Disclosed systems and techniques are directed to correcting an out-of-plane (OPD) deformation of a substrate by causing a stress-compensation layer (SCL) to be deposited on the substrate, obtaining, using optical inspection data, a profile of the OPD of the substrate. The techniques further include obtaining a dataset with a representation of an influence function for the substrate, the influence function characterizing a deformation response of the substrate caused by a point-like mechanical influence. The techniques further include performing a regression computation to determine, based at least on the profile of the OPD of the substrate and the influence function, a distribution of a stress-mitigation irradiation of the SCL that mitigate the OPD of the substrate. The techniques further include performing, using the deter- (Continued)

mined distribution of the stress-mitigation irradiation, a stress-mitigation irradiation of the SCL.

20 Claims, 9 Drawing Sheets

Related U.S. Application Data filed on May 16, 2023, provisional application No. 63/502,448, filed on May 16, 2023, provisional application No. 63/502,447, filed on May 16, 2023, provisional application No. 63/491,170, filed on Mar. 20, 2023, provisional application No. 63/444,158, filed on Feb. 8, 2023.

(51) Int. Cl.

| | |
|---|---|
| ***C23C 14/54*** | (2006.01) |
| ***G01B 9/02*** | (2022.01) |
| ***G01B 11/16*** | (2006.01) |
| ***H10P 14/60*** | (2026.01) |
| ***H10P 14/694*** | (2026.01) |
| ***H10P 30/20*** | (2026.01) |
| ***H10P 30/40*** | (2026.01) |
| ***H10P 72/00*** | (2026.01) |
| ***H10P 74/00*** | (2026.01) |
| ***H10W 42/00*** | (2026.01) |

(52) U.S. Cl.
CPC .......... *G01B 9/02095* (2013.01); *G01B 11/16* (2013.01); *G01B 11/162* (2013.01); *H10P 14/6518* (2026.01); *H10P 14/6539* (2026.01); *H10P 30/20* (2026.01); *H10P 30/40* (2026.01); *H10P 72/0616* (2026.01); *H10P 74/23* (2026.01); *H10W 42/121* (2026.01); *H10P 14/69433* (2026.01)

(58) Field of Classification Search
CPC ................. H10P 72/0616; H10P 74/23; H10P 14/69433; H10P 50/00; C23C 14/48; C23C 14/54; C23C 14/547; C23C 14/18; G01B 9/02095; G01B 11/16; G01B 11/162; H10W 42/121
See application file for complete search history.

(56) References Cited

U.S. PATENT DOCUMENTS 10,847,419 B2 * 11/2020 Miller ..................... H10P 54/00
2005/0278126 A1 12/2005 Rosakis et al.
2006/0123919 A1 6/2006 Lovell et al.
2006/0276977 A1 12/2006 Rosakis et al.
2007/0180919 A1 8/2007 Rosakis et al.
2011/0037155 A1 2/2011 Pagaila
2012/0286285 A1 11/2012 Godet et al.
2014/0107998 A1 4/2014 Vukkadala et al.
2016/0005662 A1 1/2016 Yieh et al.
2017/0125268 A1 5/2017 Dang et al.
2017/0162522 A1 6/2017 Chang et al.
2017/0178891 A1 6/2017 Batinica et al.
2017/0287752 A1 10/2017 Godet et al.
2018/0067403 A1 3/2018 Devilliers
2018/0329310 A1 11/2018 Coskun et al.
2019/0041758 A1 2/2019 Van Dijk et al.
2019/0287854 A1 9/2019 Miller et al.
2019/0378737 A1 12/2019 Gutman et al.
2019/0393069 A1 12/2019 Paranjpe et al.
2020/0118822 A1 4/2020 Falk et al.
2021/0047729 A1 2/2021 Yao et al.
2021/0050411 A1 2/2021 Zhang et al.
2021/0247701 A1 8/2021 Li et al.
2021/0264076 A1 8/2021 Yamamoto et al.
2022/0068648 A1 3/2022 Falk et al.
2022/0344171 A1 10/2022 Varghese et al.
2022/0344282 A1 10/2022 Subrahmanyan et al.
2024/0266186 A1 * 8/2024 Lin ........................ H10P 74/203

FOREIGN PATENT DOCUMENTS

JP 2001068429 A 3/2001
JP 2020148865 A 9/2020
KR 20180021133 A 2/2018
KR 20200015426 A 2/2020
WO 2017038026 A1 3/2017
WO 2022119732 A1 6/2022

OTHER PUBLICATIONS

International Search Report and Written Opinion for International Application No. PCT/US2024/014674, mailed Jun. 10, 2024, 9 Pages.
International Search Report and Written Opinion for International Application No. PCT/US2024/014676, mailed Jun. 10, 2024, 10 Pages.
International Search Report and Written Opinion for International Application No. PCT/US2024/014884, mailed May 27, 2024, 08 Pages.
International Search Report and Written Opinion for International Application No. PCT/US2024/014939, mailed Jun. 14, 2024, 09 Pages.

* cited by examiner

INFLUENCE FUNCTION-BASED MITIGATION OF SUBSTRATE DEFORMATION WITH FILM DEPOSITION AND ION IMPLANTATION

RELATED APPLICATIONS

This application claims the benefit of U.S. Provisional Patent Application No. 63/444,158, filed Feb. 8, 2023, entitled "Mitigation of stress and deformation in wafers"; U.S. Provisional Patent Application No. 63/491,170, filed Mar. 20, 2023, entitled "Optimized film deposition and ion implantation for mitigation of stress and deformation in wafers"; U.S. Provisional Patent Application No. 63/502,447, filed May 16, 2023, entitled "Mitigation of saddle deformation of wafers using film deposition and edge ion implantation"; U.S. Provisional Patent Application No. 63/502,448, filed May 16, 2023, entitled "Influence function-based mitigation of wafer deformation with film deposition and ion implantation"; U.S. Provisional Patent Application No. 63/502,452, filed May 16, 2023, entitled "Cylindric decomposition for efficient mitigation of wafer deformation with film deposition and ion implantation"; and U.S. Provisional Patent Application No. 63/511,414, filed Jun. 30, 2023, entitled "Wafer stress management for precise wafer-to-wafer bonding," the contents of which are incorporated by reference in their entirety herein.

TECHNICAL FIELD

The disclosure pertains to semiconductor manufacturing, including manufacturing of wafers.

BACKGROUND

Modern semiconducting devices, such as processing circuits, memory devices, light detectors, solar cells, light-emitting semiconductor devices, and the like, are often manufactured on silicon wafers (or other suitable substrates). Wafers may undergo numerous processing operations, such as physical vapor deposition, chemical vapor deposition, etching, photo-masking, polishing, and/or various other operations. In a continuous effort to reduce the cost of semiconductor devices, multi-layer stacks of dies, insulating films, patterned and/or doped semiconducting films, and/or other features are often deposited on a single wafer, resulting in high aspect ratio devices, which are used, e.g., in 3D flash memory devices and other applications. Deposition, patterning, etching, polishing, etc., of stacks of multi-layered structures often result in significant stresses applied to the underlying wafers. Such stresses lead to both an out-of-plane distortion and an in-plane distortion of features supported by the wafers. These distortions result in misalignment of deposited features and can significantly degrade quality of manufactured devices.

BRIEF DESCRIPTION OF THE DRAWINGS

The present disclosure will be understood more fully from the detailed description given below and from the accompanying drawings of various embodiments of the disclosure.

SUMMARY

Figure 1A:
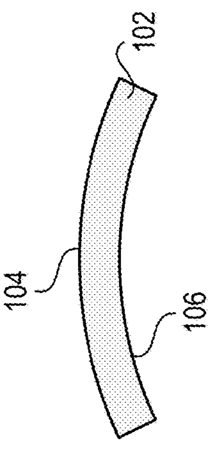
FIGS. 1A-E illustrate schematically a process of stress-correcting the back side-deposited film with an additional ion implantation, according to at least one embodiment.

In one embodiment, disclosed is a method to correct an out-of-plane deformation of a substrate, including causing a stress-compensation layer (SCL) to be deposited on the substrate. The method further includes obtaining, using optical inspection data, a profile of the out-of-plane deformation (OPD) of the substrate. The method further includes obtaining, by a processing device, a dataset comprising a representation of an influence function for the substrate, wherein the influence function characterizes deformation response of the substrate caused by a point-like mechanical influence. The method further includes performing a regression computation to determine, based at least on the profile of the OPD of the substrate and the influence function, a distribution of a stress-mitigation irradiation of the SCL that mitigates the OPD of the substrate. The method further includes performing, using the determined distribution of the stress-mitigation irradiation, a stress-mitigation irradiation of the SCL.

In another embodiment, disclosed is a system that includes a memory and a processing device communicatively coupled to the memory to cause an SCL to be deposited on a substrate. The processing device is further to obtain, using optical inspection data, a profile of an OPD of the substrate. The processing device is further to obtain a dataset comprising a representation of an influence function for the substrate, wherein the influence function characterizes deformation response of the substrate caused by a point-like mechanical influence. The processing device is further to perform a regression computation to determine, based at least on the profile of the OPD of the substrate and the influence function, a distribution of a stress-mitigation irradiation of the SCL that mitigates the OPD of the substrate. The processing device is further to perform, using the determined distribution of the stress-mitigation irradiation, a stress-mitigation irradiation of the SCL.

In another embodiment, disclosed is a system that includes a memory and a processing device communicatively coupled to the memory. The processing device is to cause an SCL to be deposited on a substrate and obtain, using optical inspection data, a profile of an OPD of the substrate. The processing device is to obtain a dataset that includes a representation of an influence function for the substrate, wherein the influence function characterizes deformation response of the substrate caused by a point-like mechanical influence. The processing device is to perform a regression computation to determine, based at least on the profile of the OPD of the substrate and the influence function, a distribution of a stress-mitigation irradiation of the SCL that mitigates the OPD of the substrate. The processing device is further to perform, using the determined distribution of the stress-mitigation irradiation, a stress-mitigation irradiation of the SCL.

In yet another embodiment, disclosed is a non-transitory computer-readable memory storing instructions thereon that, when executed by a processing device, cause the processing device to perform operations that include causing an SCL to be deposited on a substrate. The operations further include obtaining, using optical inspection data, a profile of an OPD of the substrate. The operations further include obtaining a dataset comprising a representation of an influence function for the substrate, wherein the influence function characterizes deformation response of the substrate caused by a point-like mechanical influence. The operations further include performing a regression computation to determine, based at least on the profile of the OPD of the substrate and the influence function, a distribution of a stress-mitigation irradiation of the SCL that mitigates the OPD of the substrate. The operations further include performing, using the determined distribution of the stress-mitigation irradiation, a stress-mitigation irradiation of the SCL.

DETAILED DESCRIPTION

Existing technology includes a number of methods to address wafer deformation. For example, a deformed (warped) wafer with various films and features deposited on one side (referred to as the front side, top side, or main side herein) can be coated on the other side (referred to as the back side or bottom side herein) with a film that exerts a compression stress or tensile stress on the wafer. Such back side-deposited deformation-correcting film, also referred to as a stress-compensation layer herein, usually imparts a uniform (or global) stress to the entire wafer and cannot compensate for local stress modulation and/or anisotropic stress. Additional correction can be achieved by implanting ions into the stress-compensation layer, e.g., using a beam of ions to bombard the stress-compensation layer, to adjust the stress in the stress-compensation layer and, consequently, to further mitigate the deformation of the underlying wafer.

A "wafer," as used herein, refers to any substrate or material surface formed on a substrate upon which film processing is performed during a fabrication process. For example, a wafer surface on which processing can be performed includes materials such as silicon, silicon oxide, silicon nitride, strained silicon, silicon on insulator, carbon doped silicon oxides, amorphous silicon, doped silicon, germanium, gallium arsenide, glass, sapphire, and any other materials such as metals, metal nitrides, metal alloys, and other conductive materials, depending on the application. Wafers include, without limitation, semiconductor wafers.

In some instances, wafers can include plastic substrates. Wafers may be exposed to a pretreatment process to polish, etch, reduce, oxidize, hydroxylate, anneal, UV cure, e-beam cure and/or bake the substrate surface. In addition to film processing directly on the surface of the wafer itself, any of the film processing steps disclosed may also be performed on an underlayer formed on the wafer as disclosed in more detail below, and the term "wafer surface" is intended to include such underlayer as the context indicates. Thus, for example, where a film/layer or partial film/layer has been deposited onto a wafer surface, the exposed surface of the newly deposited film/layer becomes the wafer surface. In some embodiments, wafers have a thickness in the range of 0.25 mm to 1.5 mm, or in the range of 0.5 mm to 1.25 mm, in the range of 0.75 mm to 1.0 mm, or more. In some embodiments, wafers have a diameter of about 10 cm, 20 cm, 30 cm, or more.

Figure 5:
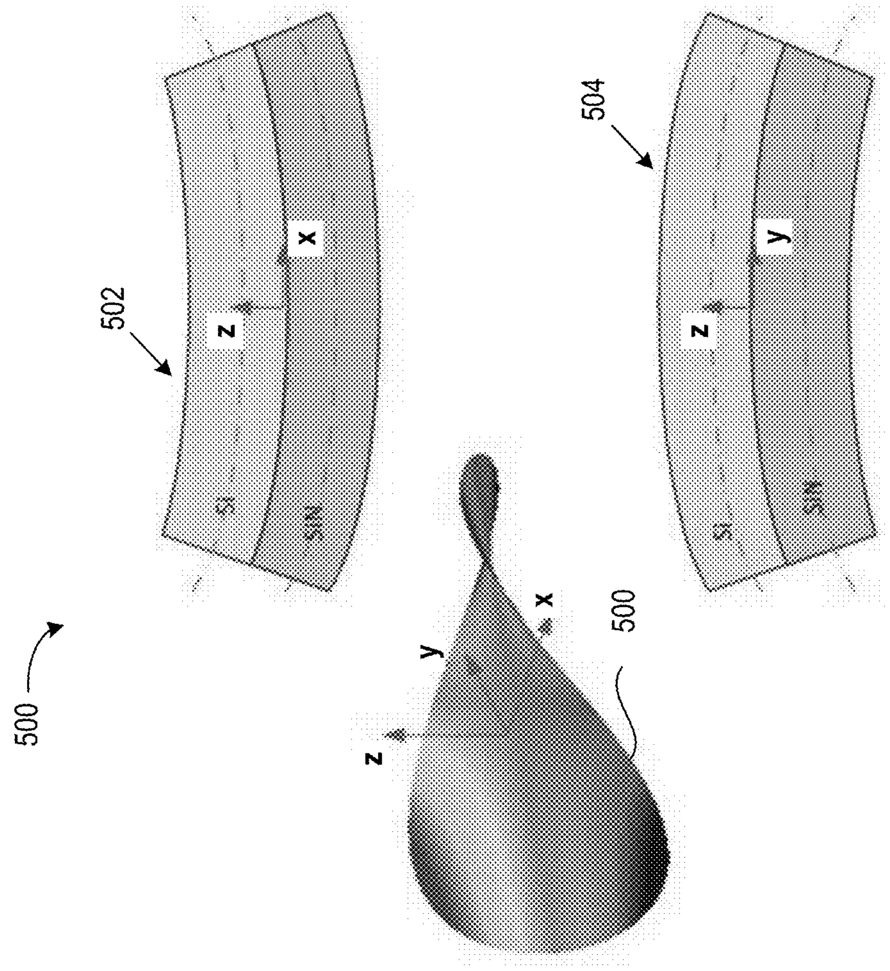
FIG. 5 illustrates an example silicon wafer with a Silicon Nitride film deposited thereon having a saddle-shaped deformation, according to at least one embodiment.

Deposition of stress-compensation layers with ion implantation can be quite efficient in correcting stresses that are uniform and isotropic, $\sigma_{xx} \approx \sigma_{yy}$. On the other hand, mitigating stresses that vary with location x, y on the wafer, $\sigma_{jk}$ (x, y), stresses that are anisotropic, $\sigma_{xx} \neq \sigma_{yy}$, or both is a much more challenging problem. Certain feature patterns can result in stresses that are compressive along one direction, e.g., $\sigma_{xx}<0$, and tensile along a perpendicular direction, $\sigma_{yy}>0$, resulting in saddle-shaped wafers, e.g., as illustrated in FIG. 5. Such saddle-shaped features can arise, for example, in stacks of materials with directional patterning, e.g., patterning of wordlines in flash memory devices. Correcting such anisotropic saddle deformations in wafers remains a difficult task.

Aspects and embodiments of the present disclosure address these and other challenges of the modern semiconductor manufacturing technology by providing for systems and techniques that can mitigate non-uniform and/or anisotropic stresses and deformations (e.g., out-of-plane deformations) of wafers. In some embodiments, a wafer's deformation can be measured (e.g., using optical measurements techniques) and parameters of a stress-compensation layer (e.g., layer's material, thickness, etc.) can be determined such that the sign of the stress is the same throughout the wafer. For example, if the wafer's deformation is concave, the parameters of the stress-compensation layer may be selected to overcorrect the wafer into a convex shape. An ion implantation map (a distribution of local doses of ion implants) n(x, y) can then be computed to reduce the local stress in the wafer to a degree that brings the convex shape to a flat (or nearly flat) shape. As disclosed herein, the implantation map n(x, y) can be computed using an influence function G (x, y; x', y') that characterizes a response (e.g., deformation) of the wafer at a point (x, y) of the wafer as caused by a point-like force applied at a point (x', y') of the wafer. In some embodiments, the influence function G(x, y; x', y'), also known as the Green's function, can be determined from computational simulations or analytical calculations. In some embodiments, the influence function can be determined from one or more experiments, which can include performing ion implantation into a film deposited on a reference wafer.

In one embodiment, a vertical profile of wafer deformation $z=h(r, \phi)$ can be measured using optical metrology techniques. For example, an interferogram of the profile $h(r, \phi)$ can be obtained using optical interferometry measurements. The wafer profile $h(r, \phi)$ can then be represented via a number of parameters that qualitatively and quantitatively characterize geometry of the wafer deformation. In some embodiments, a set of Zernike (or a similar set of) polynomials can be used to represent the wafer profile, $$h(r,\ \phi) = \sum_j A_j Z_j(r,\ \phi),$$

where r is the radial coordinate and ϕ is the polar angle coordinate within the (average) plane of the wafer. Consecutive coefficients $A_1$, $A_2$, $A_3$, $A_4$ . . . represent weights of specific geometric features (elemental deformations) of the wafer described by the corresponding Zernike polynomials $Z_1(r, \phi)$, $Z_2(r, \phi)$, $Z_3(r, \phi)$, $Z_4(r, \phi)$ . . . . The first three coefficients are of less interest as they describe a uniform shift of the wafer (coefficient $A_1$, associated with the $Z_1(r, \phi)=1$ polynomial), a deformation-free x-tilt that amounts to a rotation around the y-axis (coefficient $A_2$, associated with the $Z_2(r, \phi)=2r$ cos @ polynomial), and a deformation-free x-tilt that amounts to a rotation around the x-axis (coefficient $A_3$, associated with the $Z_3(r, \phi)=2r$ sin @ polynomial) that can be eliminated by a realignment of the coordinate axes. The fourth coefficient $A_4$ is associated with $Z_4(r, \phi)=\sqrt{3}(2r^2-1)$ and characterizes an isotropic paraboloid deformation ("bow"). The fifth $A_5$ and the sixth $A_6$ coefficients are associated with $Z_5(r, \phi)=\sqrt{6}r^2$ sin 20 and $Z_6(r, \phi)=\sqrt{6}r^2$ cos 2¢ polynomials, respectively, and characterize a saddle-type deformation. The $A_5$ coefficient characterizes a saddle shape that curves up ($A_5>0$) or down ($A_5<0$) along the diagonal y=x and curves down ($A_5>0$) or up ($A_5<0$) along the diagonal y=−x. The $A_6$ coefficient characterizes a saddle shape that curves up ($A_6>0$) or down ($A_6<0$) along the x-axis and curves down ($A_6>0$) or up ($A_6<0$) along the y-axis. The higher coefficients $A_7$, $A_8$, etc., characterize progressively faster variations of the wafer deformation h(r, ϕ) along the radial direction, along the azimuthal direction, or both and collectively represent a residual deformation, $$h_{res}(r,\ \phi) = h(r,\ \phi) - \sum_{j=4}^{6} A_j Z_j(r,\ \phi).$$

Figure 2:
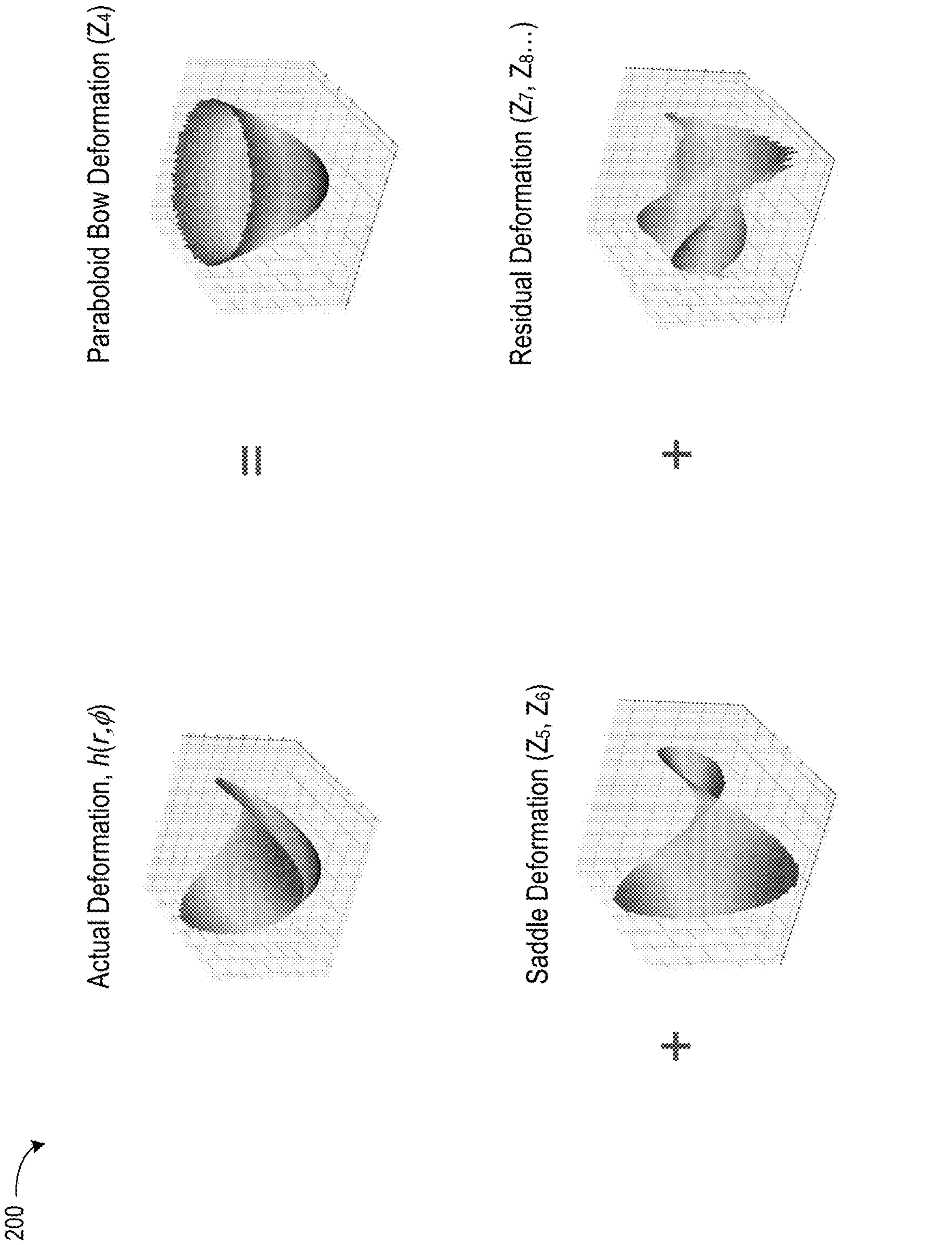
FIG. 2 illustrates an example Zernike polynomial decomposition of one actual deformation (top left) of a wafer, in arbitrary units, into a paraboloid bow deformation (top right), a saddle deformation (bottom left), and a residual deformation (bottom right), according to at least one embodiment.

FIG. 2 illustrates an example Zernike polynomial decomposition 200 of one actual deformation h(r, ϕ) (top left) of a wafer, in arbitrary units, into a paraboloid bow deformation $A_4Z_4(r, \phi)$ (top right), a saddle deformation $A_5Z_5(r, \phi)+A_6Z_6(r, \phi)$ (bottom left), and a residual deformation, $h_{res}(r, \phi)$ (bottom right), according to at least one embodiment.

Figure 1B:
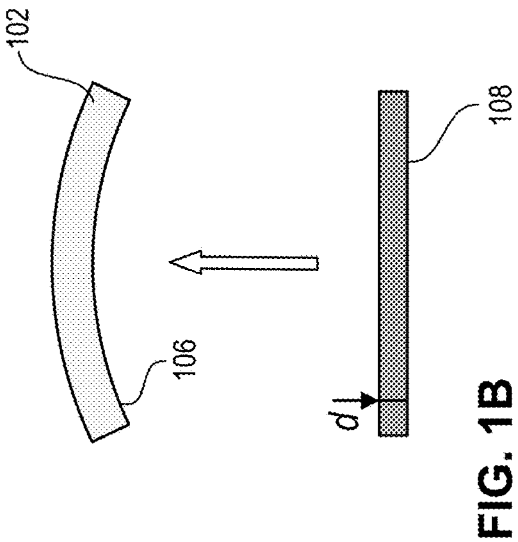

In some embodiments, selection of a thickness d of the stress-compensation film can be made based on a value of the paraboloid bow coefficient $A_4$. FIGS. 1A-E illustrate schematically a process of stress-correcting the back side-deposited film with an additional ion implantation, according to at least one embodiment. FIG. 1A depicts a wafer 102 having a deformation, which can include a paraboloid bow deformation (with negative coefficient $A_4<0$) and other deformations, e.g., a saddle deformation and a residual deformations (both not shown in FIGS. 1A-E for conciseness and ease of viewing). Wafer 102 has a front side 104 and a back side 106. Any number of features (e.g., deposition and/or etching patterns), dies, photo-masks, and/or any other structures can be deposited on or etched in the front side 104. In some embodiments, back side 106 can be free from deposited/etched features/structures. In some embodiments, back side 106 can also have one or more deposited/etched features/structures. FIG. 1B illustrates schematically deposition of a stress-compensation layer on the back side of wafer 102. In some embodiments, stress-compensation layer 108 can include one or more films of different materials. Individual films may have a thickness in the range of 10 nm to 200 nm, or in the range of 20 nm to 180 nm, or in the range of 30 nm to 160 nm, or in the range of 40 nm to 140 nm, or more. A total thickness of the stress-compensating layer may be up to several microns or even more. In some embodiments, stress-compensation layer 108 is deposited at a temperature in the range of 100° ° C. to 500° C. or higher.

Figure 1C:
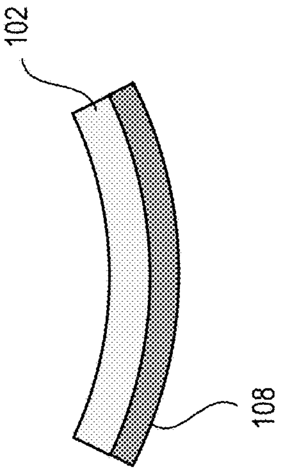

A material (type) of stress-compensation layer 108 can be selected based on the sign of coefficient $A_4$. For example, for a negative bow, $A_4<0$, and stress-compensation layer 108 can be selected to have a compressive stress after deposition and cause the bottom surface of the wafer to have tensile stress (as illustrated in FIGS. 1A-E). For silicon wafers, such a film can be a silicon nitride ($Si_3N_4$) film. Conversely, for a positive bow, $A_4>0$, and stress-compensation layer 108 may be selected to have a tensile stress (not shown in FIGS. 1A-E). Stress-compensation layer 108 can be deposited using any suitable deposition techniques including physical vapor deposition (e.g., sputtering), chemical vapor deposition (e.g., plasma-assisted deposition), epitaxy, exfoliation, and/or the like. Deposition can be performed at room temperature or at temperatures different from room temperature (e.g., at an elevated temperature). In some embodiments, a thickness d of stress-compensation layer 108 can be selected to overcorrect the deformation to some degree, e.g., as illustrated in FIG. 1C where a negative paraboloid bow becomes a positive paraboloid bow. The thickness-dependent paraboloid bow correction $A_{corr}(d)$ changes wafer deformation from h(r, ϕ) to $h_{corr}(r, \phi)$:

$$h_{corr}(r,\ \phi) = h(r,\ \phi) + A_{corr}(d)\cdot Z_4(r,\ \phi).$$

Figure 1D:
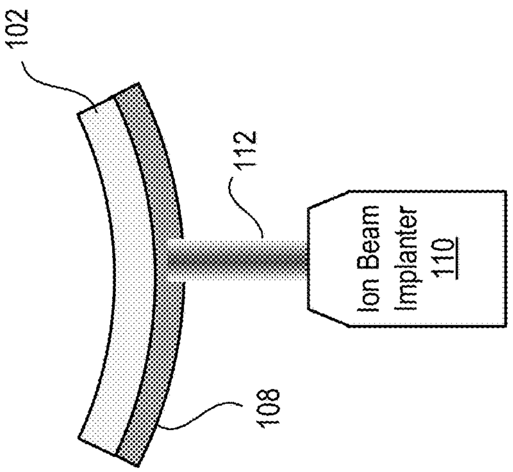

The overcorrection is chosen in conjunction with the implant species, energy, and dose to ensure maximum entitlement from the stress compensation. The overcorrection makes the combined structure of wafer 102 and stress-compensation layer 108 susceptible to further control of stress (and thus deformation of the wafer $h_{corr}(r, \phi)$). As illustrated in FIG. 1D, an ion beam implanter 110 can generate an ion beam 112 that strikes stress-compensation layer 108 and deposits ions therein. Ion beam 112 can carry silicon ions, phosphorus ions, argon ions, neon ions, xenon ions, krypton ions, and/or the like. In some embodiments, the energy and type of ions in ion beam 112 can be selected to limit the implanted ions to the volume of stress-compensation layer 108 without allowing the ions to reach wafer 102. Ions that lodge in stress-compensation layer 108 create substitution defects therein. Additionally, the ions leave a trail of vacancy defects along paths of propagation in stress-compensation layer 108. The substitution defects and/or vacancies modify (e.g., reduce) stress in stress-compensation layer 108 and can reduce the degree of stress overcorrection caused by the film deposition. This causes the combination of wafer 102 and stress-compensation layer 108 to flatten.

Although, for the sake of specificity, a stress-mitigation beam that is used to modify the stress in stress-compensation layer 108 is referred to as ion beam (e.g., ion beam 112) throughout this disclosure, the stress-mitigation beam (irradiation) can include other matter particles (e.g., electrons), electromagnetic waves (e.g., UV light, visible light, infrared light, etc.), and/or a suitable combination thereof. The stress-mitigation beam strikes stress-compensation layer 108 and changes the bonding network of stress-compensation layer 108. For example, the stress-mitigation beam of low energy may interact with surface atoms of stress-compensation layer 108, e.g., removing some of the surface atoms, effectively implementing etching of surface regions of stress-compensation layer 108. The effectiveness of such etching may be controlled by a choice of ion species/radicals/ambient gasses. In another example, the stress-mitigation beam of high energy can deposit ions inside stress-compensation layer 108. Ions and/or photons can break bonds of the bonding network (or crystal lattice) of stress-compensation layer 108 forming vacancies therein, and can further cause annealing due to local heating, UV curing, and/or other effects.

In some embodiments, the number of ions $\Delta N_i$ deposited per small area $\Delta A=\Delta x\Delta y$ of the wafer may be determined using simulations (performed as described in more detail below) based on the local value of the corrected deformation $h_{corr}(r, \phi)$, which may include a saddle deformation, a residual deformation, and the part of the paraboloid bow deformation $A_{corr}(d)+A_4$ that has been overcorrected by the deposition of stress-compensation layer 108. The desired local density $n(x, y)=\Delta N_i/\Delta x\Delta y$ of the ions can be delivered by controlling the scanning velocity v of ion beam 112. In some embodiments, ion beam 112 has a profile that can be approximated with a Gaussian function, e.g., the ion flux $j(p)=j_0\exp(-x^2/a^2-y^2/b^2)$, where x and y are Cartesian coordinates, $j_0$ is the maximum ion flux at the center of the beam, and a and b is are characteristic spreads of the beam along the x-axis and y-axis, respectively. Correspondingly, a point that is located at distance y from the path of the center of the beam receives an ion dose that includes the following number of ions:

$$\frac{\Delta N_i}{\Delta x\Delta y}=\frac{j_0}{v}\int_{-\infty}^{\infty}dxe^{-x^2/a^2-y^2/b^2}=\frac{j_0\sqrt{\pi}}{va}e^{-y^2/b^2}.$$

Correspondingly, by reducing the scanning velocity v, the number of ions received by various regions of stress-compensation layer 108 can be increased, and vice versa. Additionally, ion beam 112 can perform multiple scans with different offsets y so that various points of stress-compensation layer 108 receive multiple doses of ions with different factors $e^{-y^2/b^2}$ that can average to a target dose. For example, after n passes of ion beam implanter 110, each made with a respective velocity $v_k$ at a different distance $y_k$ from the center of ion beam 112 to the area $\Delta x\Delta y$, the total dose of ions received by this area will be $$n(x_x y)=\left.\frac{\Delta N_i}{\Delta x\Delta y}\right|_{total}=j_0\sqrt{\pi}\sum_{k=1}^{n}\frac{e^{-y_k^2/b^2}}{av_k}.$$

Figure 1E:
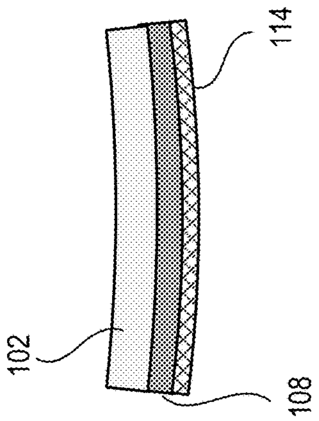

As illustrated in FIG. 1E, an implantation layer 114 formed as part of stress-compensation layer 108 results in a significant mitigation of deformation of wafer 102, and in particular its saddle and residual portions.

Figure 3:
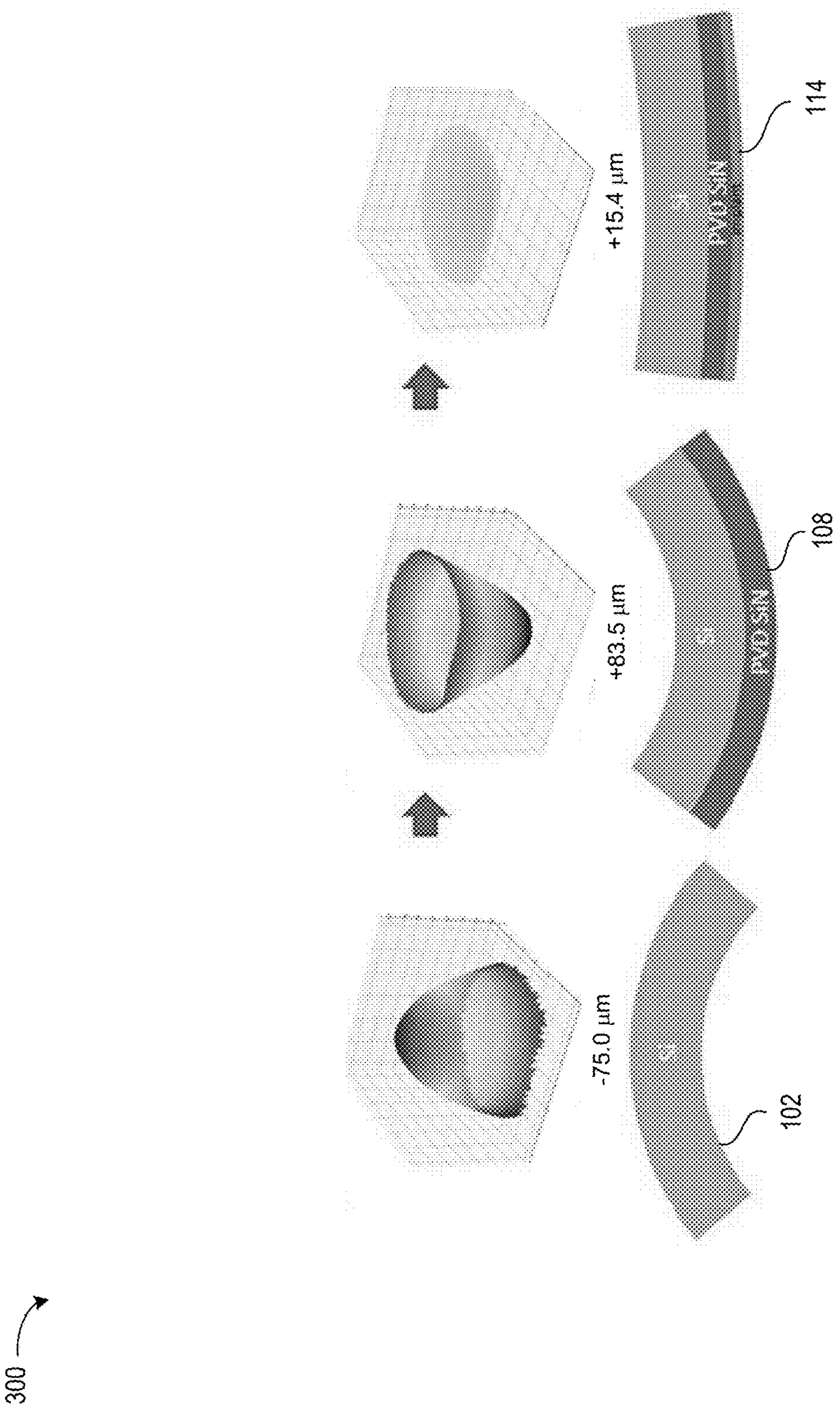
FIG. 3 illustrates stress and deformation mitigation in one example wafer using the process disclosed in relation to FIGS. 1A-E, according to at least one embodiment.
Figure 4:
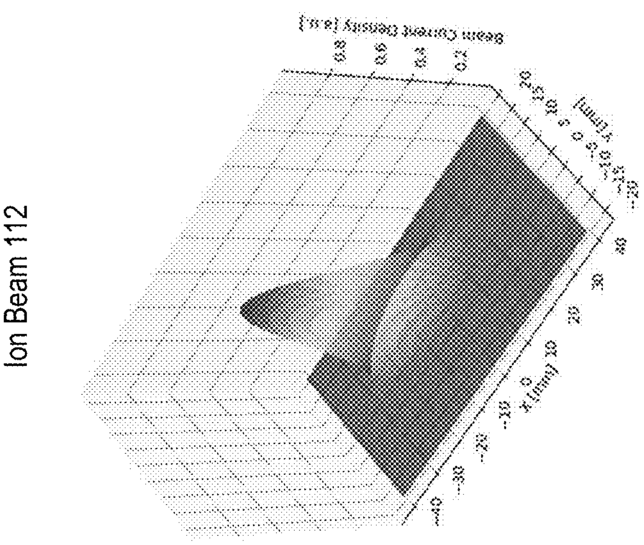
FIG. 4 illustrates one example profile of a Gaussian ion beam that can be used for stress and deformation mitigation in wafers, according to at least one embodiment.

FIG. 3 illustrates stress and deformation mitigation 300 in one example wafer using the process disclosed in relation to FIGS. 1A-E, according to at least one embodiment. As depicted in FIG. 3, a 30 cm Silicon wafer 102 with the maximum negative deformation of −75.0 μm is first overcorrected to the maximum deformation of +83.5 μm using a Silicon Nitride tensile stress-compensation layer 108. The stresses in stress-compensation layer 108 are then reduced by the formation of implantation layer 114 with an ion beam, resulting in a final maximum deformation of +15.4 μm. FIG. 4 illustrates one example profile 400 of a Gaussian ion beam 112 that can be used for stress and deformation mitigation in wafers, according to at least one embodiment.

The techniques of strain and deformation mitigation illustrated in FIGS. 1-3 can also be applied to a wafer having a complex deformation in which stress tensor components $\sigma_{xx}$ and $\sigma_{yy}$ have different signs causing the wafer to have a saddle deformation. FIG. 5 illustrates an example wafer 500 (e.g., a silicon wafer with a Silicon Nitride film deposited thereon) having a saddle-shaped deformation, according to at least one embodiment. As seen in the cross-sectional xz view 502, the stress component $\sigma_{xx}$ may be lower in the wafer (the top layer) than in the film (the bottom layer) deposited on the back side of the wafer. Conversely, as illustrated with the cross-sectional yz view 504, the stress component $\sigma_{yy}$ may be higher in the wafer than in the film. In some embodiments, the state of stress in the wafer may be represented by the location-dependent stress tensor which may be approximated as, $$\sigma(x, y)=\begin{pmatrix}\sigma_{xx} & \sigma_{xy} & \sigma_{xz}\\ \sigma_{yx} & \sigma_{yy} & \sigma_{yz}\\ \sigma_{zx} & \sigma_{zy} & \sigma_{zz}\end{pmatrix}\approx\begin{pmatrix}\sigma_{xx} & 0 & 0\\ 0 & \sigma_{yy} & 0\\ 0 & 0 & 0\end{pmatrix}.$$

This structure of the stress tensor is usually a good approximation since the wafer is typically in a state of pure bending and independent of the shear stresses that are represented by the off-diagonal terms in the stress tensor. Correction of the saddle shape requires special handling in the computation of the dose map and optimization to ensure that additional residual terms are not introduced into the wafer as a result.

Figure 6:
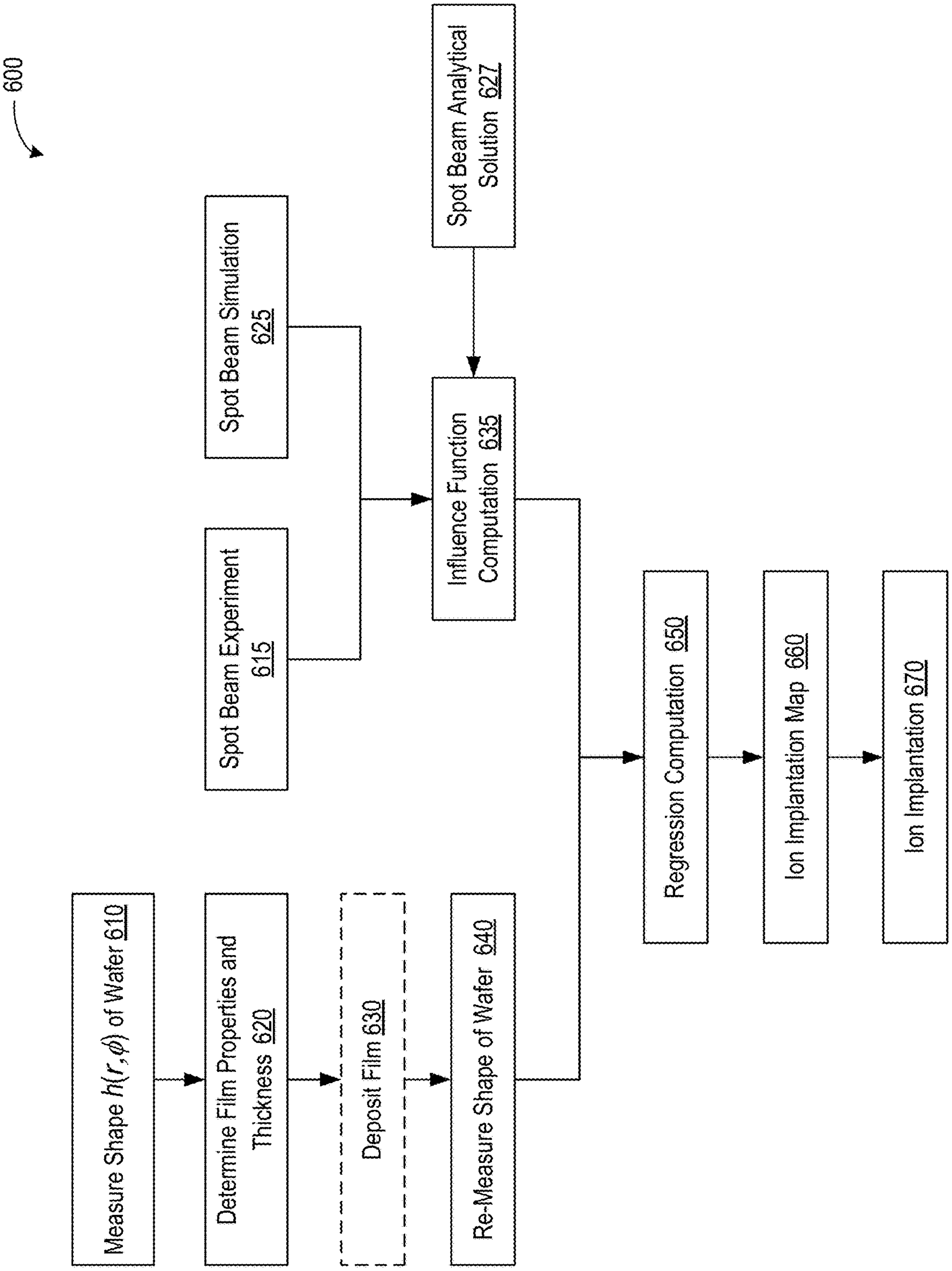
FIG. 6 is a flowchart illustrating an example process of influence function-based mitigation of a wafer deformation, according to at least one embodiment.

FIG. 6 is a flowchart illustrating an example process 600 of influence function-based mitigation of a wafer deformation, according to at least one embodiment. Process 600 can be performed using a semiconductor manufacturing system that includes one or more processing chambers, e.g., deposition chamber(s), plasma chamber(s), etching chamber(s), polishing chamber(s), film removal chamber(s), beam irradiation chamber(s), optical inspection chamber(s), and/or the like. The processing chambers can be connected to one or more transfer chambers, which can be equipped with robot(s) to handle wafers, e.g., moving wafers into and out of processing chambers. The transfer chamber can further be connected to a load-lock chamber (Front-End Interface) that can be coupled to one or more Front Opening Unified Pod carriers that hold bare wafers, processed wafers, partially processed wafers, and/or the like. Operations performed by the semiconductor manufacturing system, including any, some or all operations of process 600, can be performed responsive to instructions issued by a suitable computing device having a processing logic and memory to store the instructions.

At block 610, process 600 includes measuring a shape of a wafer, e.g., a displacement $h_W(\vec{r})$ of a surface (e.g., top surface or bottom surface) of a wafer as a function of radius-vector r that can be represented using any suitable set of in-plane coordinates, e.g., polar coordinates, $h_W(r, \phi)$, Cartesian coordinates, $h_W(x, y)$, or any other coordinates. In some embodiments, the wafer deformation $h_W(\vec{r})$ can be represented via a decomposition of the determined shape over a suitable set of basis functions, e.g., Zernike polynomials, or some other set of polynomials. The wafer deformation $h_W(\vec{r})$ can be caused by effective deforming pressure $P_{DEF}(\vec{r})$ applied to the top surface of the wafer as a result of local stresses caused by patterning/etching of the wafer, deposition of one or more films on the top surface of the wafer, and/or any other technological operations performed on the wafer. The relation between the wafer deformation and the effective deforming pressure can be described by the classical plate equation, $$D\nabla^4 h_W(\vec{r}) = P_{DEF}(\vec{r}),$$

where t is the thickness of the wafer, $D=Et^3/12(1-v^2)$ is the flexural rigidity of the wafer; E and v are, respectively, Young's modulus and Poisson's ratio of a wafer material; and $\nabla^2=\partial^2/\partial x^2+\partial^2/\partial y^2$ is the planar Laplacian operator. The wafer deformation $h_W(+)$ is accompanied by a planar stress, which at the bottom surface of the wafer is, $$\sigma_W(\vec{r}) = \sigma_{xx} + \sigma_{yy} = \frac{Et}{2(1-v)}\nabla^2 h_W(\vec{r}).$$

The planar stress can be negative (compressive) in some areas of the wafer, $\sigma_W(\vec{r})<0$, and positive (tensile) in other areas of the wafer, $\sigma_W(\vec{r})>0$.

At block 620, the determined deformation $h_W(\hat{r})$ can be used to identify properties (e.g., material and thickness) of a target stress-compensation film to be deposited on the wafer. In some embodiments, the film can be selected in such as a way as to make the stress $\sigma_{WF}$ in the new wafer/film structure of a definite sign. In the example of FIG. 3, the bottom side of Si wafer 102 experiences a compressive stress, e.g., $\sigma_{WF}<0$. The stress-compensation layer 108 may be selected to cause the wafer stress at the bottom side of wafer 102 to reverse sign and become tensile throughout the whole area of the wafer, $\sigma_{WF}>0$. More specifically, the stress-compensation film (layer) exerts effective local pressure $P_F(\vec{r})$ causing the wafer to change deformation $h_W(\vec{r})\rightarrow h_{WF}(\vec{r})$, where $$D\nabla^4 h_{WF}(\vec{r}) = P_{DEF}(\vec{r}) + P_F(\vec{r}).$$

The material and thickness of stress-compensation layer 108 can be selected in such a way that $P_F(\vec{r})$ is sufficiently large (by the absolute value) to ensure that $$\sigma_{WF} = \frac{Et}{2(1-v)}\nabla^2 h_{WF}(\vec{r}) > 0.$$

This is advantageous because ion implantation can reduce the amount of stress in the film while reversing the sign of the tension in the film with ions may be more difficult.

At block 630 of FIG. 6, process 600 can include depositing the film (stress-compensation layer) of the selected material and thickness on the wafer. In some embodiments, process 600 can include re-measuring 640 (e.g., using optical interferometry) the wafer deformation $h_{WF}(\vec{r})$ modified by the film. In some embodiments, instead of performing the re-measurement, the modified wafer deformation $h_{WF}(\vec{r})$ can be estimated based on the value $P_F(\vec{r})$. In some embodiments, $P_F(\vec{r})$ can have a uniform value throughout the area of the wafer (e.g., being caused by the deposited film of a uniform thickness): $P_F=Cd$, where d is the thickness of the film and C is an empirically determined coefficient that depends on a specific material type. Different materials can be characterized by coefficients C that have different magnitudes and signs.

The measured (and/or estimated) deformation $h_{WF}(\vec{r})$ of the wafer can be used to determine a ion implantation dose map $n(\vec{r})$ that mitigates the stress $\sigma_{WF}(\vec{r})$ and reduces deformation to zero (or near zero), $h_{WF}(\vec{r})\rightarrow 0$. Non-uniform ion implantation causes the uniform pressure exerted by the film to be reduced by an amount $\Delta P(\vec{r})$ determined by the local ion dose:

$$P_{F-1}(\vec{r}) = P_F - \Delta P_I(\vec{r}) = Cd - Kn(\vec{r}),$$

where K is a constant that depends on the type of ions, energy of ions, angle of ion implantations, and/or other parameters of the ion implantation process. Under ideal conditions, the ion implantation correction $\Delta P(\vec{r})$ can be selected to cause the total pressure to vanish, $P_{DEF}(\vec{r})+P_{F-1}(\vec{r})=P_{DEF}(\vec{r})+P_F-\Delta P_1(\vec{r})=0$. Since effective deforming pressure $P_{DEF}(\vec{r})$ is difficult to estimate, determination of the ion-implantation correction $\Delta P_1(\vec{r})$ can be more efficiently made based on the deformation $h_{WL}(\vec{r})$ caused by the deforming pressure $P_{DEF}(\vec{r})+P_F$ exerted by various features patterned on the wafer and the deposited film. In particular, the ion-implantation correction $\Delta P_1(\vec{r})$ that compensates for the deformation $h_{WL}(x, y)$ obeys the following equation, $$D\nabla^4 h_{WL}(\vec{r}) = \Delta P_I(\vec{r}).$$

Block 635 may include computing the influence function (Green's function) for the classical plate equation, $$D\nabla^4 G(\vec{r};\vec{r}') = \delta(\vec{r}-\vec{r}') \equiv \delta(x-x')\delta(y-y'),$$

where $\delta(\ )$ is the Dirac delta-function. As follows by its definition, the influence function characterizes deformation of a wafer (e.g., an undeformed wafer) at a point r as caused by a unit force applied at a point $\vec{r}'$. Once the influence function is known, the deformation caused by the ion-implantation correction $\Delta P_1(\vec{r})$ can be determined by the integral over the whole area of the wafer, $$h_{WL}(\vec{r}) = \int\int d^2r' G(\vec{r};\vec{r}')\Delta P(\vec{r}').$$

As described below in conjunction with block 650, solution of this equation can determine a local density of ions for ion implantation.

In some embodiments, the integrals over the area of the wafer can be computed as discrete sums over patches of size $\Delta l_x \times \Delta l_y$. For example, for wafers of 30 cm in diameter, the discrete patches can be $\Delta l_x = \Delta l_y = 5$ mm, 10 mm, 12 mm, and/or the like. In various embodiments, the influence function is defined in Cartesian coordinates, $G(\vec{r}; \vec{r}') = G(x, y; x', y')$, and the integration is likewise performed in the Cartesian coordinates. In some embodiments, the influence function (and the deformation) can be defined in arbitrary other coordinates, e.g., polar coordinates, $G(\vec{r}; \vec{r}'), = G(r, \phi; r', \phi')$, with the integration measure adjusted accordingly, $dx'dy' \rightarrow r'dr'd\phi'$.

The influence function $G(\vec{r}; \vec{r}')$ can be determined using a variety of techniques. In one embodiment, as indicated with block 615, the influence function $G(\vec{r}; \vec{r}')$ can be determined using experimental data. For example, a spot ion beam of a reference intensity (flux) $j(x-x_0, y-y_0)$ can be centered on different points $(x_0, y_0)$ of the film of a known thickness on a reference wafer, e.g., an undeformed wafer for a reference time $\Delta t$ (thus depositing $n(\vec{r}) = j(\vec{r})\Delta t$ ions per unit area of the film) and the resulting change of deformation $\Delta h(x, y)$ caused by the beam can be measured. In some embodiments, the spot beam can be a Gaussian beam, $j(x-x_0, y-y_0) = j_0 \exp(-(x-x_0)^2/a^2-(y-y_0)^2/b^2)$, having extent a along the x-axis and extent b along the y-axis (in some embodiments, the beam profile can be symmetric, a=b). Different points on a radius of the wafer can be probed, e.g., a set of points $(x_0, y_0) = (0,0)$; (l, 0); (2l, 0) and so on, that may be separated by spacing l along a given radial direction (e.g., direction of the x-axis in this example). Spacing l can be of the same order of magnitude as the size of the discretization patch, e.g., $\Delta l_x$ and/or $\Delta l_y$. In some embodiments, spacing l can be position-dependent, e.g., with larger spacings l (lower resolution) used to probe wafer deformation caused by spot beam 112 centered near the middle portion of the wafer/film (near the center of wafer/film) and smaller spacings l (higher resolution) used to prove wafer deformation caused by spot beam 112 centered near the edges of wafer/film.

Figure 7A:
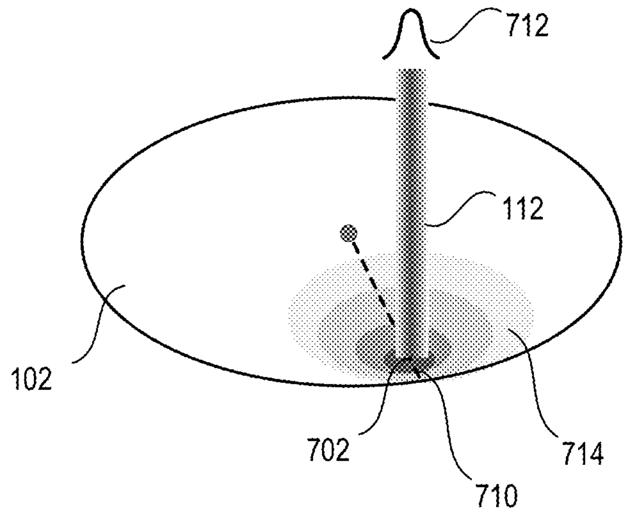
FIGS. 7A-7C illustrate ion implantation using a spot beam centered at a series of points along a radial direction, according to at least one embodiment.
Figure 7B:
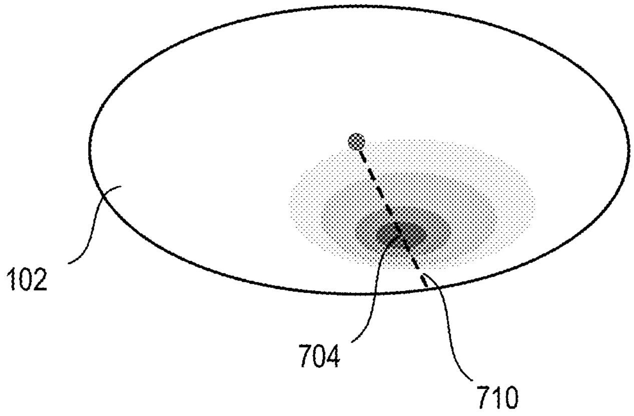
Figure 7C:
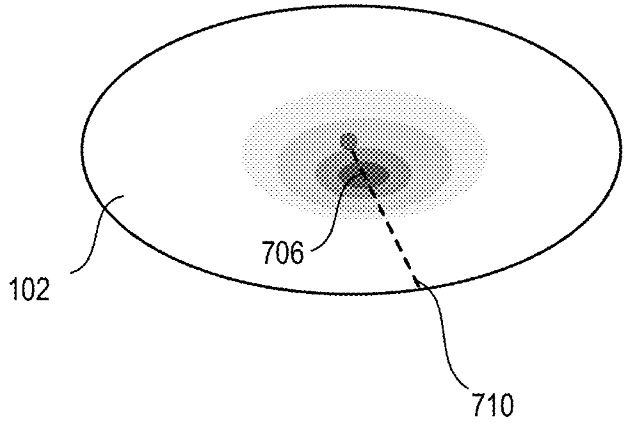

FIGS. 7A-7C illustrate ion implantation using a spot beam 112 centered at a series of points 702, 704, 706 along a radial direction 710, according to at least one embodiment. Spot beam can have a Gaussian shape 712 or any other suitable shape. The amount of deformation caused by spot beam 112 centered at a point $\vec{r}_0 = (x_0, y_0)$ and applied to the film for duration $\Delta t$ can be expressed via the influence function as follows, $$\Delta h(x, y; x_0, y_0) = K\Delta t \int\int dx'dy' G(x, y; x', y') j(x' - x_0, y' - y_0).$$

Discrete version of this equations (with the integrals replaced with sums) can be used to determine the influence function G(x, y; x', y'). More specifically, the measured deformation $\Delta h(x, y; x_0, y_0)$—illustrated schematically via a heat map 714—represents the experimental input, the shape off the ion implantation beam $j(x'-x_0, y'-y_0)$ can be a known fixed input (e.g., determined by the settings of the ion implantation apparatus, and the influence function G(x, y; x', y') G (x, y; x', y') can be obtained using inverse matrix multiplication techniques. In some embodiments, points 702, 704, 706, etc., where the spot beam 112 is centered, can be positioned along the same radial line and the axial symmetry of wafer 102 can be used to determine the influence function for other points. More specifically, the influence function can then be presumed to be the same (axial symmetry) for other locations of the source points. Expressed in polar coordinates, this axial symmetry implies that the influence function $G(r, \phi-\phi'; r')$ depends on the relative angle $\phi-\phi'$ between the directions to the "source point" $\vec{r}' = (r', \phi')$ and the "destination point" $\underline{r} = (r, \phi)$ but not on $\phi$ and $\phi'$ separately. In some embodiments, since real wafers (and/or wafer/film structures) can be slightly non-symmetric, deformations $\Delta h(\vec{r}; \vec{r}_0)$ caused by application of spot beam 112 along different directions can be measured and subsequently averaged (after being appropriately superimposed following a suitable rotation) and the average value can be used in determining the influence function $G(\vec{r}; \vec{r}')$. In other embodiments, the influence function $G(\vec{r}; \vec{r}')$ can be measured for a certain portion of source points $\vec{r}'$(e.g., a quadrant of wafer 102) and subsequently extended to the whole area of wafer 102.

In some embodiments, a linear nature of the wafer deformation can be used advantageously with multiple measurements of $\Delta h(\vec{r}; \vec{r}_0)$ being taken on a single wafer (wafer/film structure). More specifically, a wafer uniformly deformed with a deposited film can be illuminated with ion beams 112 centered at a series of points $\vec{r}_0$, $\vec{r}_1$, $\vec{r}_2$, etc., and consecutive increments of deformation $\Delta h(\vec{r}; \vec{r}_0)$, $\Delta h(\vec{r}; \vec{r}_1)$, $\Delta h(\vec{r}; \vec{r}_2)$, etc., can be measured after each ion beam illumination, each increment $\Delta h(\vec{r}; \vec{r}_j)$ representing deformation that is independent of other doses received previously. This can be repeated until a large ion dose is imparted into the film. At such large doses (where a significant percentage of atomic bonds in the film are broken by ions), wafer deformation becomes saturated and additional doses received by the same locales of the film no longer result in a noticeable further change in the wafer deformation. Once the film is saturated with ions, the film can be removed (chemically or physically), a new film can be deposited on the same wafer, and additional series of ion implantation experiments can be performed.

Referring again to FIG. 6, in some embodiments, instead of (or in addition to) carrying out spot beam experiment(s) 615, process 600 can include performing spot beam simulation 625. More specifically, a deformation $\Delta h(\vec{r}; \vec{r}_0)$ caused by the pressure, $K\Delta t j(\vec{r}-\vec{r}_0)$, exerted by the ion-modified film can be simulated using Finite Element Analysis (FEA) methods. For example, deformation $\Delta h(\vec{r}; \vec{r}_0)$ can be determined by solving the classical wave equation with appropriate boundary conditions (e.g., supported boundary conditions, free boundary conditions, etc.). The simulated deformation $\Delta h(\vec{r}; \vec{r}_0)$ can then be used for influence function $G(\vec{r}; \vec{r}')$ computation 635, e.g., as described above in conjunction with the deformation measured in spot beam experiment(s) 615.

In some embodiments, as depicted with block 627, process 600 can include obtaining an analytical solution for a spot beam. For example, operations of block 627 can include computing influence function $G(\vec{r}; \vec{r}')$ can as a series over a suitable set of functions, e.g., cos $m\phi$ and sin $m\phi$ angular functions, and a set of radial polynomials, e.g., Bessel polynomials, Laguerre polynomials, Zernike polynomials, and/or the like. In some embodiments, operations of block 627 can include obtaining an approximate analytic representation for influence function $G(\vec{r}; \vec{r}')$.

The influence function $G(\vec{r}; \vec{r}')$ obtained at block 635 enables a computing device to perform a regression computation 650 to determine an ion implantation map $n(\vec{r})=K^{-1}\Delta P_1(\vec{r})$, with a film-dependent (e.g., material-dependent and/or thickness-dependent) coefficient K. Regression computation 650 can include computing the inverse influence function $G^{-1}(\vec{r}; \vec{r}')$, followed by computation of a convolution of the inverse influence function with the deformation of the wafer/film structure, $$n(\vec{r}) = K^{-1}\int\int d^2r' G^{-1}(\vec{r}; \vec{r}')h_{WF}(\vec{r}').$$

In some embodiments, convolution may be performed matrix multiplication, $$n(\vec{r}_j) = K^{-1}A\sum_{\vec{r}_k} G^{-1}(\vec{r}_j; \vec{r}_k)h_{WF}(\vec{r}_k).$$

using a discretized representation of the radius-vector $\vec{r} \Rightarrow \vec{r}_j$ on a mesh of points $\vec{r}_j$ each point associated with an elemental area $A=\Delta l_x \times \Delta l_y$. In some embodiments, the two-dimensional deformation $h_{WL}(\vec{r}_k)$ (and, similarly, the ion implantation map $n(\vec{r}_j)$) can be represented as a column-wise (or row-wise) vector whose dimension (the number of components) is equal to the number of points in the mesh. Since the wafer typically has a circular shape, the number of points associated with different horizontal and vertical lines of the wafer need not be the same. Similarly, the influence function $G(\vec{r}_j; \vec{r}_k)$ and the inverse influence function $G^{-1}(\vec{r}_j; \vec{r}_k)$ can be matrices in the same representation. The inverse influence function can be computed as the matrix that is inverse to the influence function $$A\sum_{\vec{r}_k} G^{-1}(\vec{r}_j; \vec{r}_k)G(\vec{r}_k; \vec{r}_l) = \delta_{jl},$$

with $\delta_{jl}$ being the Kronecker delta symbol.

In some embodiments, direct application of the regression computation can result in negative ion densities $n(\vec{r}_j)$ for at least some points r of the wafer/film structure. Negative ion densities mean that, for the corresponding points, the stress of the film has to be increased rather than reduced. Ions, however, can reduce the stress in the film (e.g., by breaking crystalline bonds of the film material) whereas achieving increased stress can be more difficult, under some conditions. Such situations can be handled using a number of different techniques. In one embodiment, a film of a larger thickness t (that causes more strain in the wafer) can be deposited on the wafer, e.g., by adding more material to the film already deposited on the wafer and recomputing ion implantation map 660 (e.g., by repeating blocks 630-650). In another embodiment, the film thickness may be left unmodified. Instead, a target wafer deformation $h_{TARGET}(\vec{r}_j)$ can be modified. For example, instead of attempting to achieve a completely flat waver with $$h_{TARGET}(\vec{r}_j) = h_{WL}(\vec{r}_j) - KA\sum_{\vec{r}_k} G(\vec{r}_j; \vec{r}_k)n(\vec{r}_k) = 0,$$

the ion implantation dose $n(\vec{r}_k)$ can be selected in a way that minimizes a suitably chosen cost function COST. In some embodiments, the cost function can be the least square average cost function, e.g., $$\text{COST} = \sum_{\vec{r}_k}[h_{TARGET}(\vec{r}_j)]^2.$$

In some embodiments, one or more constraints can be included in the cost function. For example, some of the constraints can include one or more of the following: a condition that the density of implanted ions be a positive function, $n(\vec{r}_k)>0$, a condition that the density of implanted ions at any locale of the film be limited by some maximum value, $n(\vec{r}_k) \le n_{MAX}$, a condition that the maximum density of implanted ions not exceed a certain number a of the minimum density $n_{MAX} \le \alpha n_{MIN}$, a condition that the range of variation of the density of implanted ions be limited to a certain range, $n_{MAX}-n_{MIN} \le \beta$, a constraint on the maximum film density, a constraint on the maximum absolute deformation $|h_{TARGET}(\vec{r}_j)|$, a constraint on the maximum residual stress, $|\nabla^2 h_{WF}(\vec{r}_j)|$, and/or any other constraints, as may be set by a process supervisor.

Figure 9B:
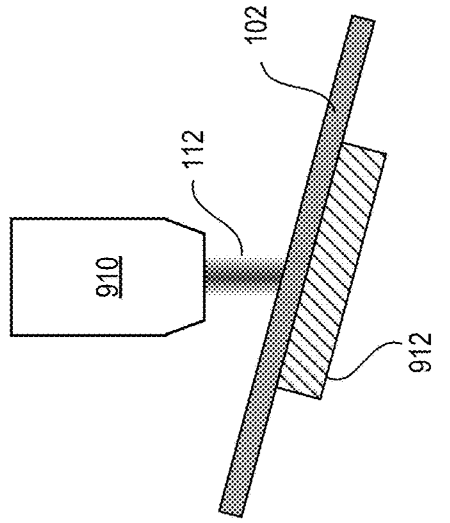
FIG. 9B illustrates a delivery of ions to a wafer at an arbitrary angle of incidence by the ion implantation system of FIG. 9A, according to at least one embodiment.

At block 670, the computed ion implantation map 660 can be applied to the stress-compensation film, e.g., as disclosed in conjunction with FIGS. 9A-B below.

Figure 8:
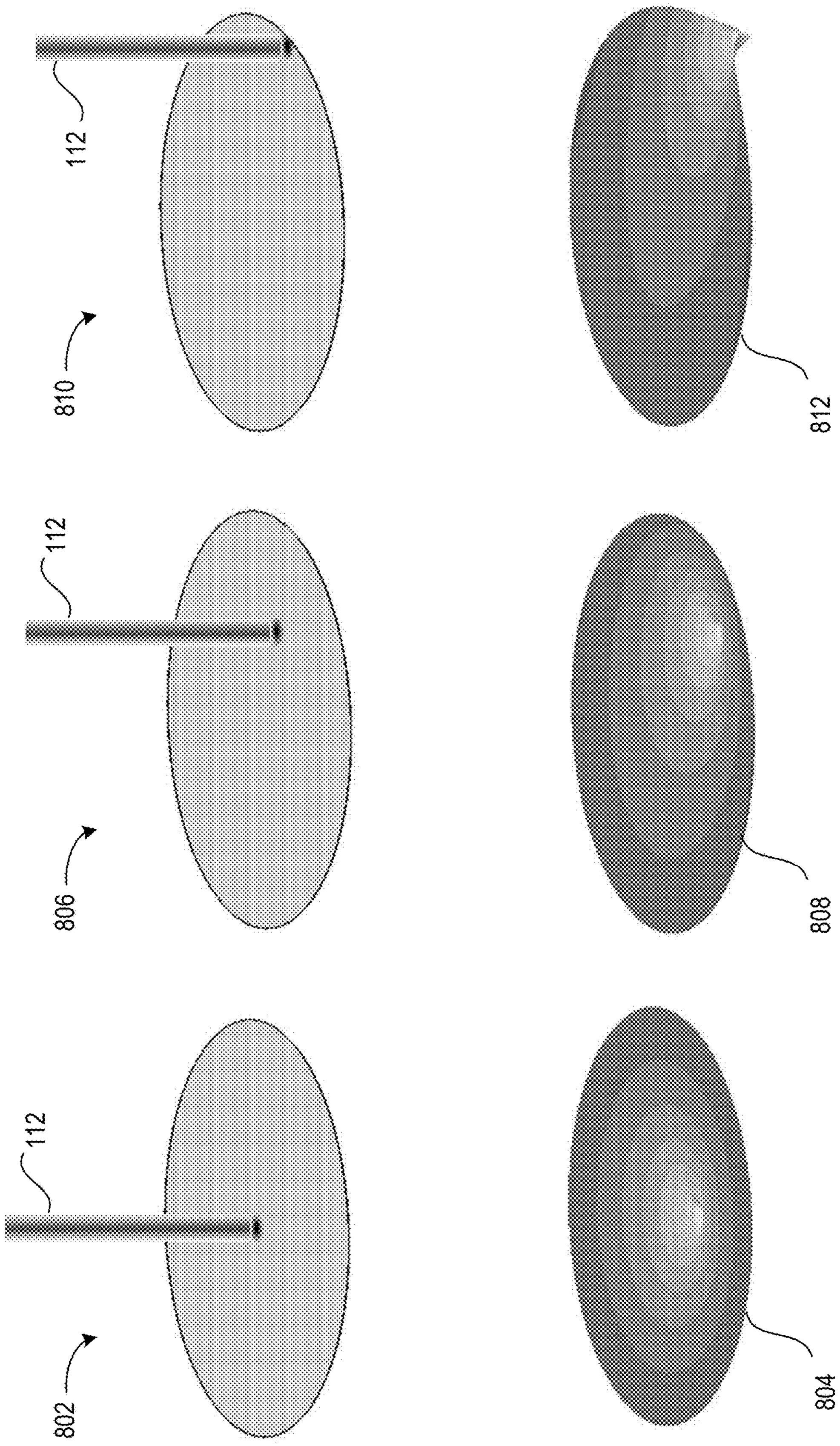
FIG. 8 depicts results of simulations of deformations caused by an ion implantation beam directed to different locations on a wafer/film structure, according to at least one embodiment.

FIG. 8 depicts results of simulations of deformations caused by an ion implantation beam directed to different locations on a wafer/film structure, according to at least one embodiment. In the instance 802, ion implantation beam is directed to the center of the wafer/film structure, resulting in deformation 804; brighter (darker) regions of the wafer/film structure indicating larger (smaller) deformations. In the instance 806, ion implantation beam 112 is directed to a middle portion of the wafer/film structure, resulting in deformation 808. In the instance 810, ion implantation beam 112 is directed to an edge portion of the wafer/film structure, resulting in deformation 812.

Figure 9A:
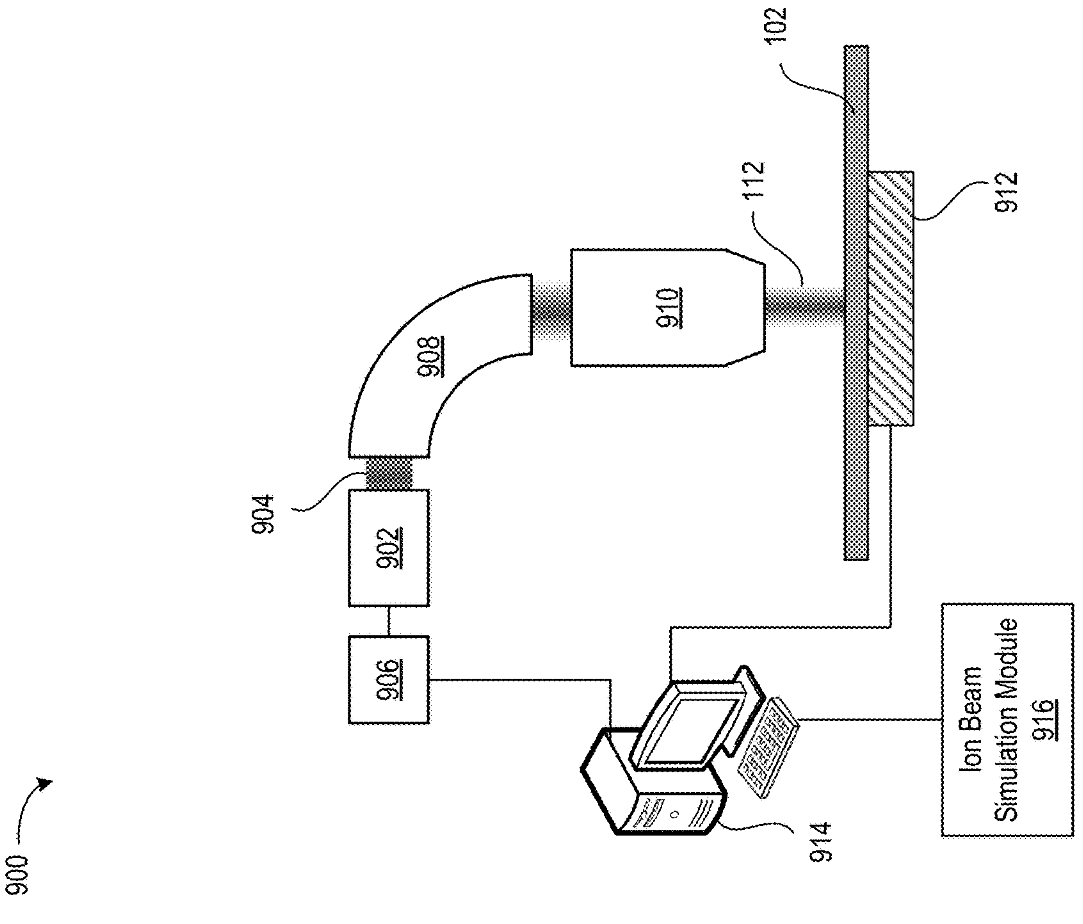
FIG. 9A illustrates schematically an ion implantation system capable of performing ion implantation into stress-compensation layers, according to at least one embodiment.

FIG. 9A illustrates schematically an ion implantation system 900 capable of performing ion implantation into stress-compensation layers, according to at least one embodiment. Ion implantation system 900 may be a part of a semiconductor manufacturing system that includes one or more processing chambers that process a wafer. Ion implantation system 900 can be or include ion beam implanter 110 of FIG. 1. Although, for the sake of specificity, a stress-mitigation beam that is used to modify the stress in a stress-compensation layer 108 is referred to as ion beam (e.g., ion beam 112), in some embodiments, the stress-mitigation beam can include other matter particles (e.g., electrons), electromagnetic waves (e.g., UV light, visible light, infrared light, etc.), and/or a suitable combination thereof. Ion implantation system 900 can include an ion source 902 for producing an ion beam 904. Ion source 902 can include a chamber for generating ions (e.g., a plasma chamber). Ion source 902 can be powered by a power source 906 and can include an extraction electrode assembly (not shown). Ion implantation system 900 can include a mass spectrometer 908 and a collimating and focusing column 910. Collimating and focusing column 910 can direct ion beam 112 to wafer 102. Wafer 102 can be supported by a support stage 912. In some embodiments, support stage 912 and wafer 102 can remain stationary during scanning of wafer 102 by ion beam 112 while components of ion implantation system 900 can be repositioned relative to wafer 102. In some embodiments, ion implantation system 900 can be stationary while support stage 912 can reposition wafer 102. Scanning with ion beam 112 can occur along multiple directions, e.g., along x-axis and along y-axis according to any suitable predetermined pattern, e.g., back-and forth along x-axis, in a spiral pattern, and so on. In various embodiments, ion beam 112 can be scanned at a frequency of several Hz, tens of Hz, hundreds of Hz, thousands of Hz, or more.

Operations of ion implantation system 900 can be controlled by a controller 914, which can include any suitable computing device, microcontroller, or any other processing device having a processor, e.g., a central processing unit (CPU), a field-programmable gate array (FPGA), an application-specific integrated circuit (ASIC), and/or the like, and a memory device, e.g., a random-access memory (RAM), read-only memory (ROM), flash memory, and/or the like or any combination thereof. Controller 914 can control operations of power source 906, support stage 912, and/or various other components and modules of ion implantation system 900. Controller 914 can include an ion beam simulation module 916 capable of performing simulations that determine a target intensity of ion beam 112 to be used to mitigate various wafer deformations. In some embodiments, support stage 912 can impart a tilt, e.g., in one or two spatial directions to wafer 102 to change an angle of incidence of ion beam 112 relative to wafer 102. In some embodiments, instead of tilting wafer 102, controller 914 can cause a tilt of ion implantation system 900 relative to wafer 102.

Figure 10:
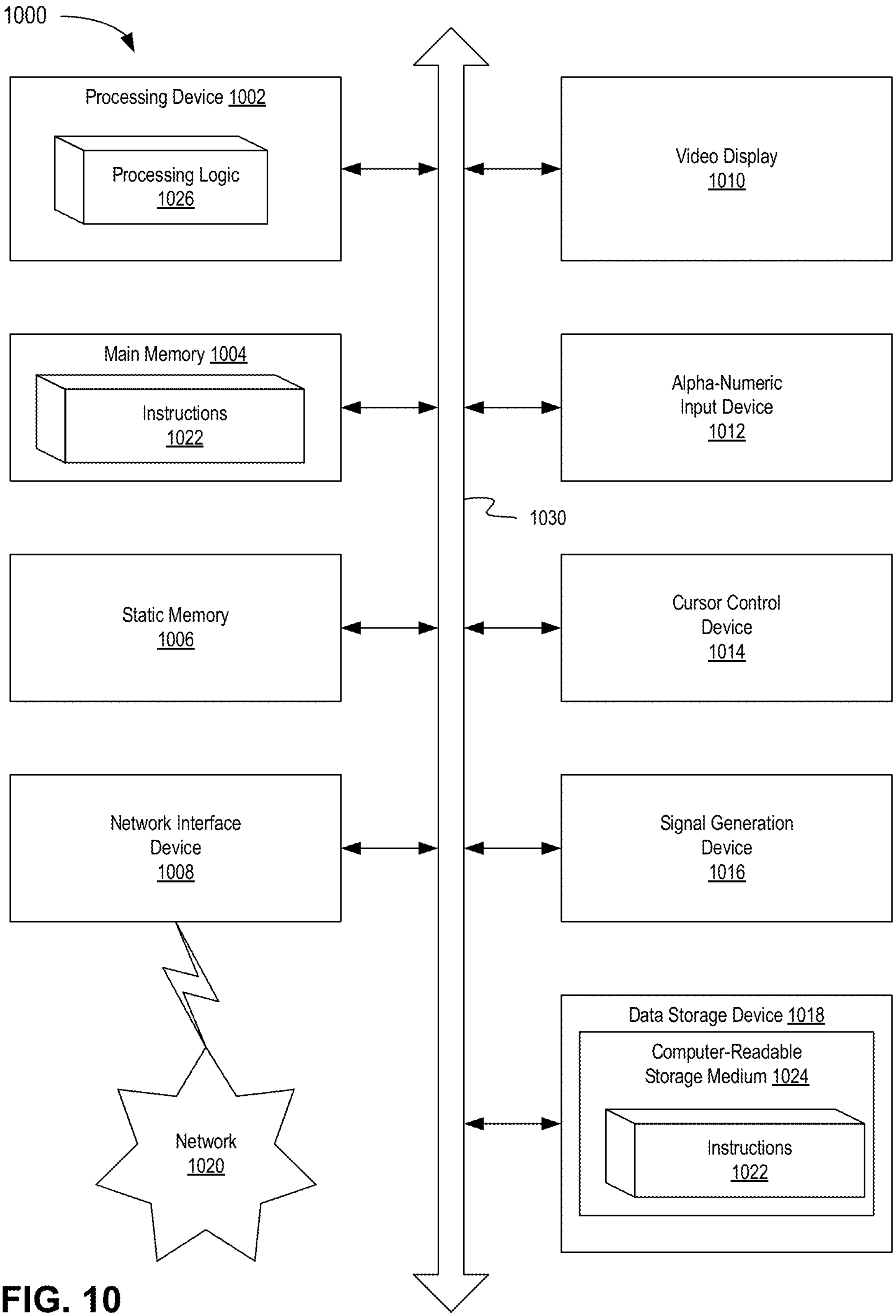
FIG. 10 depicts a block diagram of an example computer system capable of supporting operations of the present disclosure, according to at least one embodiment.

FIG. 10 depicts a block diagram of an example computer system 1000 capable of supporting operations of the present disclosure, according to at least one embodiment. In various illustrative examples, example computer system 1000 may be or include controller 914 of FIG. 9. Example computer system 1000 may be connected to other computer systems in a LAN, an intranet, an extranet, and/or the Internet. Computer system 1000 may operate in the capacity of a server in a client-server network environment. Computer system 1000 may be a personal computer (PC), a set-top box (STB), a server, a network router, switch or bridge, or any device capable of executing a set of instructions (sequential or otherwise) that specify actions to be taken by that device. Further, while only a single example computer system is illustrated, the term "computer" shall also be taken to include any collection of computers that individually or jointly execute a set (or multiple sets) of instructions to perform any one or more of the methods discussed herein.

Example computer system 1000 may include a processing device 1002 (also referred to as a processor or CPU), a main memory 1004 (e.g., read-only memory (ROM), flash memory, dynamic random access memory (DRAM) such as synchronous DRAM (SDRAM), etc.), a static memory 1006 (e.g., flash memory, static random access memory (SRAM), etc.), and a secondary memory (e.g., a data storage device 1018), which may communicate with each other via a bus 1030.

Processing device 1002 represents one or more general-purpose processing devices such as a microprocessor, central processing unit, or the like. Processing device 1002 may include processing logic 1026. Processing device 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 1002 may be configured to execute instructions implementing example process 600 of influence function-based mitigation of a wafer deformation.

Example computer system 1000 may further comprise a network interface device 1008, which may be communicatively coupled to a network 1020. Example computer system 1000 may further comprise a video display 1010 (e.g., a liquid crystal display (LCD), a touch screen, or a cathode ray tube (CRT)), an alphanumeric input device 1012 (e.g., a keyboard), a cursor control device 1014 (e.g., a mouse), and an acoustic signal generation device 1016 (e.g., a speaker).

Data storage device 1018 may include a computer-readable storage medium (or, more specifically, a non-transitory computer-readable storage medium) 1024 on which is stored one or more sets of executable instructions 1022. In accordance with one or more aspects of the present disclosure, executable instructions 1022 may comprise executable instructions implementing example process 600 of influence function-based mitigation of a wafer deformation.

Executable instructions 1022 may also reside, completely or at least partially, within main memory 1004 and/or within processing device 1002 during execution thereof by example computer system 1000, main memory 1004 and processing device 1002 also constituting computer-readable storage media. Executable instructions 1022 may further be transmitted or received over a network via network interface device 1008.

While the computer-readable storage medium 1024 is shown in FIG. 10 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other embodiment examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method to correct an out-of-plane deformation (OPD) of a substrate, the method comprising:
- causing a stress-compensation layer (SCL) to be deposited on the substrate;
- obtaining, using optical inspection data, a profile of the OPD of the substrate;
- obtaining, by a processing device, a dataset comprising a representation of an influence function for the substrate, wherein the influence function characterizes a deformation response of the substrate caused by a point-like mechanical influence;
- performing a regression computation to determine, based at least on the profile of the OPD of the substrate and the influence function, a distribution of a stress-mitigation irradiation of the SCL that mitigates the OPD of the substrate; and
- performing, using the determined distribution of the stress-mitigation irradiation, a stress-mitigation irradiation of the SCL.

2. The method of claim 1, wherein the influence function is determined based on one or more simulations characterizing an OPD of a reference substrate caused by a known mechanical influence.

3. The method of claim 2, wherein the one or more simulations deploy a finite element analysis.

4. The method of claim 1, wherein the influence function is determined using one or more experiments, wherein each of the one or more experiments comprises a measurement of a reference substrate OPD caused by a reference stress-mitigation beam directed into a reference SCL deposited on the reference substrate.

5. The method of claim 1, wherein the regression computation is subject to one or more constraints.

6. The method of claim 1, wherein the distribution of the stress-mitigation irradiation of the SCL is determined to minimize a mean squared OPD of a substrate deformation after the stress-mitigation irradiation of the SCL.

7. The method of claim 1, wherein the substrate comprises a front side and a back side, wherein the front side comprises one or more manufactured features, and wherein the SCL is deposited on the back side of the substrate.

8. The method of claim 1, wherein causing the SCL to be deposited on the substrate comprises:
- performing a polynomial decomposition of the profile of the OPD of the substrate to determine a plurality of polynomial coefficients, each of the plurality of polynomial coefficients characterizing a respective one of a plurality of elemental deformation shapes of the substrate; and
- identifying, based on at least a subset of the plurality of polynomial coefficients, one or more characteristics of the SCL for the substrate, wherein the one or more characteristics of the SCL comprise at least one of:
  - a material of the SCL, or
  - a thickness of the SCL.

9. The method of claim 1, further comprising:
- determining settings for the stress-mitigation irradiation of the SCL, wherein the settings comprise one or more of:
  - a type of particles of a stress-mitigation beam used for the stress-mitigation irradiation of the SCL,
  - an energy of the particles of the stress-mitigation beam, or
  - an angle of incidence of the particles of the stress-mitigation beam on the SCL.

10. A system comprising:
- a memory; and
- a processing device communicatively coupled to the memory, the processing device to:
  - cause a stress-compensation layer (SCL) to be deposited on a substrate;

obtain, using optical inspection data, a profile of an out-of-plane deformation (OPD) of the substrate;

obtain a dataset comprising a representation of an influence function for the substrate, wherein the influence function characterizes a deformation response of the substrate caused by a point-like mechanical influence;

perform a regression computation to determine, based at least on the profile of the OPD of the substrate and the influence function, a distribution of a stress-mitigation irradiation of the SCL that mitigates the OPD of the substrate; and perform, using the determined distribution of the stress-mitigation irradiation, a stress-mitigation irradiation of the SCL.

11. The system of claim 10, wherein the influence function is determined based on one or more simulations characterizing an OPD of a reference substrate caused by a known mechanical influence.

12. The system of claim 11, wherein the one or more simulations deploy a finite element analysis.

13. The system of claim 10, wherein the influence function is determined using one or more experiments, wherein each of the one or more experiments comprises a measurement of a reference substrate OPD caused by a reference stress-mitigation beam directed into a reference SCL deposited on the reference substrate.

14. The system of claim 10, wherein the regression computation is subject to one or more constraints.

15. The system of claim 10, wherein the distribution of the stress-mitigation irradiation of the SCL is determined to minimize a mean squared OPD of a substrate deformation after the stress-mitigation irradiation of the SCL.

16. The system of claim 10, wherein the substrate comprises a front side and a back side, wherein the front side comprises one or more manufactured features, and wherein the SCL is deposited on the back side of the substrate.

17. The system of claim 10, wherein to cause the SCL to be deposited on the substrate, the processing device is to:

perform a polynomial decomposition of the profile of the OPD of the substrate to determine a plurality of polynomial coefficients, each of the plurality of polynomial coefficients characterizing a respective one of a plurality of elemental deformation shapes of the substrate; and identify, based on at least a subset of the plurality of polynomial coefficients, one or more characteristics of the SCL for the substrate, wherein the one or more characteristics of the SCL comprise at least one of:

a material of the SCL, or a thickness of the SCL.

18. The system of claim 10, wherein the processing device is further to:

determine settings for the stress-mitigation irradiation of the SCL, wherein the settings comprise one or more of:

a type of particles of a stress-mitigation beam used for the stress-mitigation irradiation of the SCL, an energy of the particles of the stress-mitigation beam, or an angle of incidence of the particles of the stress-mitigation beam on the SCL.

19. A semiconductor manufacturing system comprising:

one or more processing chambers to process a substrate; and a computing device to:

cause a stress-compensation layer (SCL) to be deposited on the substrate;

obtain, using optical inspection data, a profile of an out-of-plane deformation (OPD) of the substrate;

obtain a dataset comprising a representation of an influence function for the substrate, wherein the influence function characterizes a deformation response of the substrate caused by a point-like mechanical influence;

perform a regression computation to determine, based at least on the profile of the OPD of the substrate and the influence function, a distribution of a stress-mitigation irradiation of the SCL that mitigates the OPD of the substrate; and perform, using the determined distribution of the stress-mitigation irradiation, a stress-mitigation irradiation of the SCL.

20. The semiconductor manufacturing system of claim 19, wherein the influence function is determined based on at least one of:

one or more simulations characterizing an OPD of a reference substrate caused by a known mechanical influence, or one or more experiments, wherein each of the one or more experiments comprises a measurement of a reference substrate OPD caused by a reference stress-mitigation beam directed into a reference SCL deposited on the reference substrate.

* * * * *